(12) United States Patent
Wilson

(10) Patent No.: US 7,447,279 B2
(45) Date of Patent: Nov. 4, 2008

(54) METHOD AND SYSTEM FOR INDICATING ZERO-CROSSINGS OF A SIGNAL IN THE PRESENCE OF NOISE

(75) Inventor: David L. Wilson, Muskego, WI (US)

(73) Assignee: Freescale Semiconductor, Inc., Austin, TX (US)

( * ) Notice: Subject to any disclaimer, the term of this patent is extended or adjusted under 35 U.S.C. 154(b) by 739 days.

(21) Appl. No.: 11/047,402

(22) Filed: Jan. 31, 2005

(65) Prior Publication Data

US 2006/0171494 A1    Aug. 3, 2006

(51) Int. Cl.
H04L 27/06  (2006.01)
G10L 19/00  (2006.01)
(52) U.S. Cl. .................. 375/340; 375/346; 704/213
(58) Field of Classification Search .............. 375/224, 375/226, 254, 285, 316, 340, 346, 350; 324/76.11, 324/76.13, 76.15, 76.17, 76.38; 704/211, 704/213, 233
See application file for complete search history.

(56) References Cited

U.S. PATENT DOCUMENTS

| | | | |
|---|---|---|---|
| 4,764,720 A | 8/1988 | Nystrom | |
| 5,170,046 A * | 12/1992 | Kusakabe | 235/492 |
| 5,291,200 A | 3/1994 | Lo | |
| 5,764,024 A | 6/1998 | Wilson | |
| 6,079,045 A * | 6/2000 | Van Den Enden | 714/780 |
| 6,304,538 B1 * | 10/2001 | Hayashi | 369/59.22 |
| 6,647,324 B2 | 11/2003 | Creutzburg et al. | |
| 2002/0037032 A1 * | 3/2002 | Nakamura et al. | 375/222 |
| 2005/0094745 A1 * | 5/2005 | Miyanaga et al. | 375/320 |
| 2006/0044990 A1 * | 3/2006 | Kawabe et al. | 369/124.14 |

FOREIGN PATENT DOCUMENTS

EP    0738871 A2    10/1996

\* cited by examiner

Primary Examiner—Young T. Tse
(74) Attorney, Agent, or Firm—Charles W. Bethards

(57) ABSTRACT

A device, method, and computer readable medium are used in connection with providing an indication of zero crossings corresponding to a signal. The signal (113) is received. Noise is removed from the signal (103). In response to the signal with noise removed (115), pairs of points and a time value corresponding to each point are determined (105), wherein the points of each pair are proximate to a predetermined change in an amplitude of the signal. In response to the pairs and the corresponding time values (117), a zero crossing time is determined for each pair (107). A variation in the plurality of zero crossing times (119) is corrected (109). A signal (123) or indication representative of the corrected zero crossing times is output.

20 Claims, 4 Drawing Sheets

METHOD AND SYSTEM FOR INDICATING ZERO-CROSSINGS OF A SIGNAL IN THE PRESENCE OF NOISE

FIELD OF THE INVENTION

The present invention relates in general to a zero crossing detector, and more specifically to predicting zero crossings of a signal.

BACKGROUND OF THE INVENTION

In many applications, it can be crucial for a device to know when zero crossings of an analog signal occur, so that the device can synchronize on the zero crossings. A variety of technical applications and devices can benefit from a determination of zero crossings. Such applications and devices can include phase control, soft switching, power monitoring equipment, timers used in the foregoing, and the like.

A zero crossing is a point at which a signal waveform produced from a digital sampling of the analog signal, which usually appears as a sine wave, changes from having a polarity which is positive to negative or vice versa (more generally crosses an average or DC value). In many cases, however, the analog signal may be contaminated with noise, which can render a determination of the zero crossing difficult.

The noise may be synchronous with the waveform of the signal, such as noise caused by some form of phase control. In other situations, the noise may be asynchronous with the sine wave, such as occurs with noise conducted or radiated from another system.

The noise introduced into the signal can cause the signal to experience a zero crossing, i.e., the noise can cause the signal to cross from being positive to negative or vice versa. Accordingly, a noisy signal can experience multiple erroneous zero crossings.

Conventional filtering techniques, e.g., utilizing a filter, can be used to remove noise from the signal. The changes in amplitude introduced by the noise can be mitigated by such filtering. The filtering, however, typically introduces a phase shift into the signal. Therefore, the time associated with the zero crossing can be obscured by the phase shift.

Sometimes the analog signal is fairly predictable in frequency, as can be experienced in some systems, e.g., using 50-cycle or 60-cycle power. On the other hand, in certain situations, such as with portable power generators, the analog signal can experience frequent changes in frequency. This can introduce additional problems because a phase shift of the filter may vary when the frequency varies.

Some conventional techniques can provide noise rejection via a tracking filter. This, however, can require a high sampling frequency, and in any event, noise introduced into the signal can create multiple zero crossing that obscure the true zero crossing.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

Figure 1:
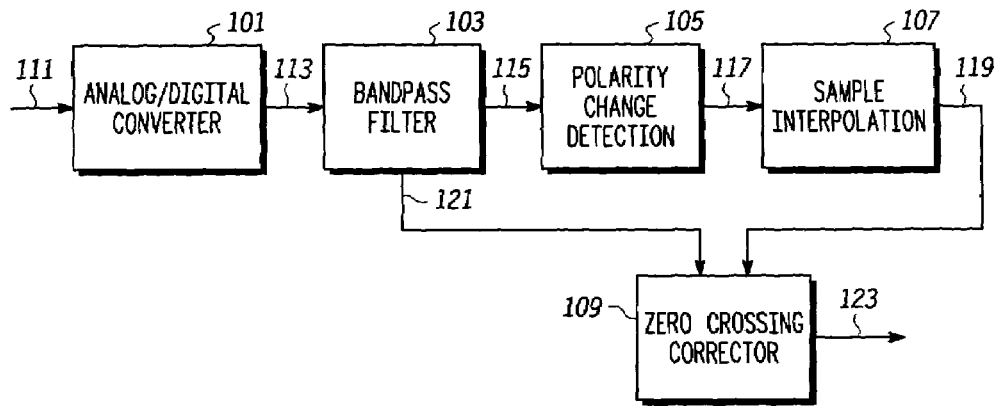
FIG. 1 is a simplified block diagram illustrating representative functional blocks associated with a device for providing an indication of zero crossings in accordance with various exemplary embodiments.

In overview, the present disclosure concerns software, hardware, and/or a combination thereof, and the like having a capability of detecting zero crossings, such as can be associated with an analog signal received from, e.g., a power generation system, a motor, a power supply, an audio component, a video representation, or the like, or with a digitized analog signal generated from, for example, such an analog signal, or with digitally stored data. Such software, hardware, and/or combination may further provide an indication of zero crossings of the signal, which can be useful in, for example, portable generators, power monitoring, power metering, power control, power factor measurement and/or correction, phase control applications, lighting systems, audio systems, motors, and the like. More particularly, various inventive concepts and principles are embodied in systems, devices, software, and methods therein for providing an indication of zero crossings associated with an analog signal or a digital signal.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation based on the teachings herein. Therefore, in the interest of brevity and minimization of any risk of obscuring the principles and concepts according to the embodiments, further discussion of such software and ICs, if any, will be limited to the essentials with respect to the principles and concepts used by the exemplary embodiments.

As further discussed herein below, various inventive principles and combinations thereof are advantageously employed to improve the determination of a zero crossing of a signal. In many cases, a signal can be contaminated with noise, where the noise itself may cause zero crossings. Determining an averaged value of zero crossings in a given window can yield an inaccurate result, particularly where there is a cyclic distortion in the waveform. Moreover, filtering the signal can phase shift the zero crossing, and any delay compensation can drift.

Further in accordance with exemplary embodiments, one or more embodiments provide an indication of zero crossings corresponding to a signal. One or more embodiments provides for receiving a signal, and removing noise from the signal, such as by an appropriate bandpass filter. A change in polarity is detected in an amplitude of the signal with the noise removed, and time values are assigned to the points just before and after each change. A zero crossing time can be determined for each pair of points, utilizing the time value assigned to the points. A potential variation in the periodicity of the zero crossing values is corrected. Also, a time delay which can be introduced by, e.g., the filter, is adjusted. An indication of the corrected zero crossing times is output, and can be further utilized in systems and devices as discussed above.

Referring now to FIG. 1, a simplified block diagram illustrating representative functional blocks associated with a device for providing an indication of zero crossings in accordance with various exemplary embodiments will be discussed and described. In overview, one or more embodiments provides for an analog/digital converter 101, a bandpass filter 103, a polarity change detection module 105, a sample interpolation module 107, and a zero crossing corrector 109.

One or more embodiments provides for converting the received signal to digital. For example, an analog signal 111 can be input to the analog/digital converter 101, and the received signal can be converted to digital. The analog/digital converter can digitize the analog signal to produce a digital signal, i.e., a digital indication of the signal 113. For example, the analog/digital converter 101 can constantly sample the analog signal 111, at a sampling rate which is appropriate for the application. The analog/digital converter 101 can output a stream of data points which correspond, e.g., to the amplitude of the signal. The analog signal 111 can be contaminated with noise, such as would occur on a 220 or 440 volt power line. It will be appreciated that the analog/digital converter 101 can be asynchronous to the device producing the analog signal 111. Appropriate analog/digital converters 101 are known in the field.

The digital signal 113 is processed by the bandpass filter 103. Advantageously, the bandpass filter 103 does not introduce a distortion into the wave form, although a time delay can be introduced (and will be addressed later). An appropriate bandpass filter is a known finite impulse response (FIR) bandpass filter.

The bandpass filter 103 provides a digital signal representative of the signal with the noise removed 115, e.g., with numerical values representative of the amplitude of the signal. For example, the bandpass filter 103 can remove frequencies that are not of interest; the zero of the bandpass filter 103 can fall on DC, so that it can strip out the DC component which may be inadvertently present in the signal, leaving only the AC component. If the removing of the noise, e.g., in the bandpass filter (e.g., the FIR bandpass filter) introduces a time delay to the signal, one or more embodiments can facilitate adjusting the plurality of zero crossing times to accommodate the time delay.

Where the bandpass filter 103 introduces a time delay, a time delay signal 121 can be provided for later use in adjusting for the time delay, e.g., by the zero crossing corrector 109.

The polarity change detection module 105 receives the digital signal representative of the signal with the noise removed 115. The polarity change detection module 105 detects when a series of points in the signal 115 changes polarity. The signal can change polarity from plus to minus, or vice versa, as would be represented by numerical values which reflect the amplitude of the signal.

Time information can be associated with the point before and the point after the change, to indicate the timing of the points proximate to the change. The time information can be indicated in various ways, e.g., system clock time, offset from an initial time, etc. The polarity change detection module 105 provides an output 117 indicating the points proximate to the change (e.g., just prior to and just after) and indicating the time value associated with each point.

The sample interpolation module 107 can estimate when the zero crossing occurred, based on the output 117 of the polarity change detection module 105. Because the analog/digital converter 101 is not necessarily synchronized to the analog signal 111 being samples, the time when the zero crossing occurs is not necessarily evenly distributed between the pair of points proximate to the change. I.e., the zero crossing can occur closer to one or the other of the points. The sample interpolation module 107 can interpolate where the zero crossing occurred between the two points, using the amplitude value and time value associated with each point.

One exemplary embodiment can assume a linear relationship between the two points and can calculate the zero crossing times, e.g., when the line was at zero amplitude. Hence, for amplitude pairs of +1 at 0 ms and −1 at 1 ms, the zero crossing is calculated to be 0.5 ms; for amplitude pairs of +1 at 0 ms and −2 at 1 ms, the zero crossing is calculated to be 0.33 ms. Accordingly, responsive to the plurality of pairs and the corresponding time values, one or more embodiments provides for performing a calculation of a zero crossing time for each pair.

Alternative exemplary embodiments can assume a different mathematical relationship between the points. Optionally, more than two points can be provided.

In accordance with one or more embodiments, the sample interpolation module 107 can provide an indication 119 of the time value of the zero crossing. The time value can be indicated in various ways, e.g., relative to a local time, a system clock time, and the like. Moreover, the time value can be provided in various ways, e.g., as a data stream, as values returned from a software call, in tabular format, etc. One or more alternative exemplary embodiments provide that the sample interpolation module 107 can provide a trigger or a pulse which fires at the time value of the zero crossing, to indicate the zero crossing.

The zero crossing corrector 109 can receive the indication 119 of the time value of the zero crossing, for a series of zero crossings. The zero crossing corrector 109 can filter the time variation that can be experienced in the signal, in order to provide a signal 123 representative of the true (as predicted) zero crossing times. Consider, for example, that the analog signal 111 is input from a portable power generator; the frequency of the signal will be jittery.

For example, consider a simplified example where the zero crossing times are determined to occur at time values including, e.g., 1.5 ms, 2.7 ms, 3.3 ms, etc. (Other analog signals, on the other hand, can be less jittery.) The time values can be averaged, for example using various mathematical techniques such as normalizing, averaging, optionally over a time window or number of values, to determine an average period of the wave form. An average using the foregoing simplified example yields a zero crossing time every 0.9 ms: 1.5 ms, 2.4 ms, 3.3 ms, etc. The next predicted zero crossing would then be at 4.2 ms.

The zero crossing corrector 109 can be provided so that a predetermined minimum number of time values for zero crossing are collected before providing the indication 119 of the time value of the zero crossing. The zero crossing corrector 109 can utilize the initial collection upon, e.g., start up, reset, re-calibration indication, or the like.

Also, the zero crossing corrector 109 can receive an optional time delay information 121, and can accommodate the time delay in the signal 123 representing the true zero crossing times. The time delay can be introduced by, e.g., the bandpass filter 103. For example, if the time delay information 121 indicates that the signal is delayed 0.2 ms, the zero crossing corrector 109 can adjust the zero crossing times to reflect the 0.2 ms delay. Accordingly, using the foregoing simplified example, the zero crossing times adjusted for the delay yields: 1.3 ms, 2.2 ms, 3.1 ms, and predicts the next zero crossing at 4.0 ms.

Figure 2:
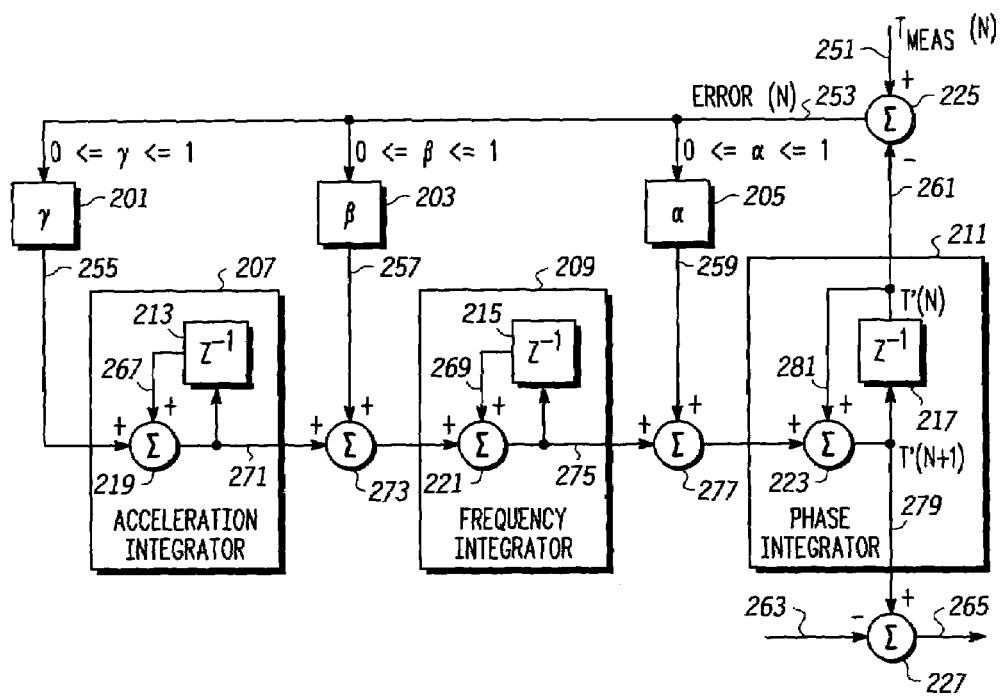
FIG. 2 is a block diagram illustrating a zero crossing corrector in accordance with various exemplary embodiments.

A further description of an exemplary embodiment of a zero crossing corrector is given in connection with FIG. 2.

It will be appreciated that the above signals, e.g., the signal 123 representing the true zero crossing times, the indication 119 of the time value of the zero crossing, the output 117 indicating the points proximate to the change and the respective time values, and/or the signal with the noise removed 115 can be provided as digital signals, as parameters or variables utilized by the device, as tabular information accessed by the device, and the like.

Further, data representing the above signals, e.g., true zero crossing times 123, time values of zero crossings 119, and/or points proximate to the change and respective time values 117 can be stored for later retrieval. For example, a history of zero crossing times can be utilized for determining a history of frequency measurements by utilizing the difference in zero crossing times.

Referring now to FIG. 2, a block diagram illustrating a zero crossing corrector in accordance with various exemplary embodiments will be discussed and described. The present example provides a third order filter. Accordingly, one or more embodiments provides that the correcting is performed in a third order filter. Alternative embodiments can provide, e.g., a low pass or average-type filter, and/or a filter of other orders, and the like. Values can be input as parameters to obtain a desired level of tracking (close to the actual zero crossing) or a desired level of filtering (e.g., disregarding noise and perturbations).

The zero crossing corrector can input a measured zero crossing time 251 and output a next predicted zero crossing 265. The zero crossing time 251 can be obtained, for example, from the sample interpolation module illustrated in FIG. 1. The output next predicted zero crossing 265 can be utilized as the signal representing the true zero crossing times described, for example, in connection with FIG. 1.

Each of the illustrated first, second and third integrator blocks 207, 209, 211 provides a prediction where the time of the zero crossing event will occur. In this example, the first integrator block 211 corrects for a phase error, the second integrator block 209 corrects for a frequency error, and the third integrator block 207 corrects for an acceleration in the periodicity of the signal. One or more embodiments can provide that $\alpha$, $\beta$, and $\gamma$ can be input as parameters: when $\alpha$, $\beta$, and $\gamma$ are high, better tracking can be obtained; when $\alpha$, $\beta$, and $\gamma$ are low, better filtering can be obtained.

In the illustrated diagram, a difference between the input measured time and time n $t_{meas}(n)$ 251 and a predicted current time of the zero crossing t'(n) 261 is determined 225, producing an error for time (n) 253. The error for time (n) 253 is provide to the $\alpha$, $\beta$, and $\gamma$ blocks 201, 203, 205. The error is multiplied to provide phase correction $\alpha$ 205, frequency correction $\beta$ 203, and acceleration correction $\gamma$ 201. The first, second and third integrator blocks 207, 209, 211 sum 219, 221, 223 the respective multiplied errors with the prior multiplied errors 267, 269, 281, and store the respective summed multiplied errors 213, 215, 217. These errors 271, 275 are summed together 273, 277 to produce the predicted time of the next zero crossing t'(n+1) 279. The predicted time of the next zero crossing 279 is adjusted by a time delay 263, which can be provided, e.g., by the bandpass filter as discussed previously in connection with FIG. 1.

Figure 3:
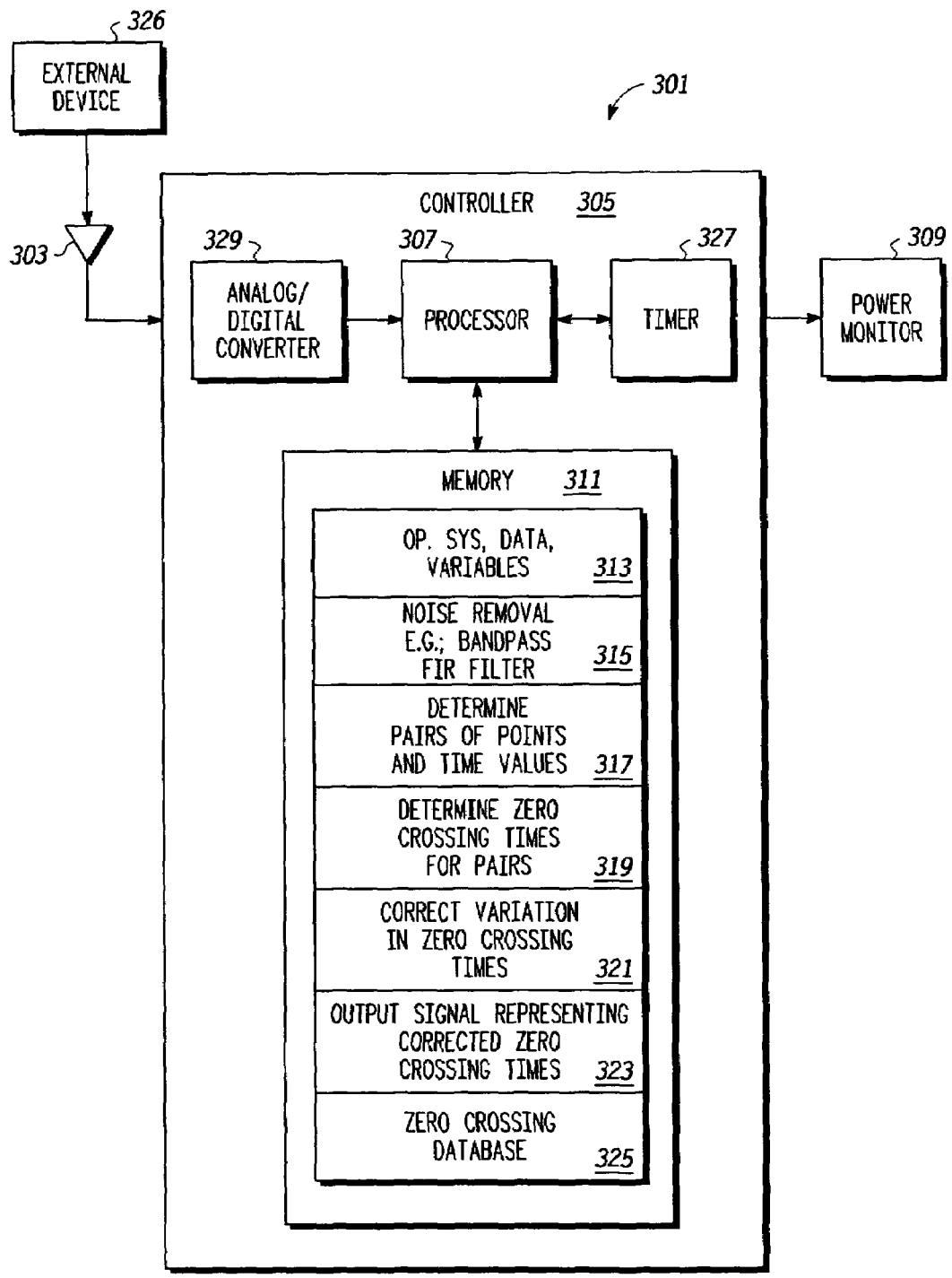
FIG. 3 is a diagram illustrating portions of an exemplary device arranged for providing an indication of zero crossing in accordance with various exemplary embodiments.

Referring now to FIG. 3, a diagram illustrating portions of an exemplary device arranged for providing an indication of zero crossing in accordance with various exemplary embodiments will be discussed and described. Examples of such devices and systems include signal processors, signal monitors, personal digital assistants, personal assignment pads, personal computers, cellular handsets or devices, or equivalents thereof.

The device 301 may include a receiver 303, one or more controllers 305. The controller may include a timer 327 or port pin (not illustrated) or similar for providing signals internally and/or externally to an external device such as the illustrated power monitor 309 or other external device, an analog/digital converter 329, a processor 307, and a memory 311.

The processor 307 may comprise one or more microprocessors, digital signal processors, and/or other processing circuitry for executing instructions. The memory 311 may be coupled to the processor 307 and may comprise a read-only memory (ROM), a random-access memory (RAM), a programmable ROM (PROM), and/or an electrically erasable read-only memory (EEPROM). The memory 311 may include multiple memory locations for storing, among other things, an operating system, data and variables 313 for programs executed by the processor 307; computer programs for causing the processor to operate in connection with various functions such as noise removal 315, determining pairs of points and time values 317, determining zero crossing times for pairs 319, correcting variations in zero crossing times 321, and outputting a signal representing the corrected zero crossing times 323; a database 325 of information regarding zero crossings; and a database (not illustrated) for other information used by the processor 307. The computer programs may be stored, for example, in ROM or PROM and may direct the processor 307 in controlling the operation of the device 301. The computer programs can be provided in any computer-readable electronic format, including, for example, over a communication line as electronic signals, on magnetic media, on optical media, and the like. Accordingly, one or more embodiments provides a computer-readable medium comprising instructions executable by a processor, the instructions including a computer-implemented method for indicating zero crossings in a signal.

The receiver 303 can be responsive to receipt of a signal, such as an analog signal received from an external device 326. In response to the received signal, the controller 305 can process the signal to convert it from analog to digital, e.g., an analog/digital converter 329 can digitize the signal. The digitized signals can then be processed by the processor 307.

The processor 307 can be programmed for noise removal 315, so as to reduce noise in the signal or to eliminate noise from the signal. For example, a filter, such as a bandpass finite impulse response (FIR) filter, responsive to the digitized signal, can remove noise from the signal. Accordingly, one or more embodiments provides that the removing is performed in a bandpass FIR filter.

The processor 307 can be programmed, responsive to the signal with noise removed, for determining a plurality of pairs of points and a time value corresponding to each point 317. The points of each pair can be proximate to a predetermined change in an amplitude of the signal, e.g., the points just before and just after the amplitude of the signal changes polarity. Additionally, a time corresponding to each point in the pair can be indicated.

The processor 307 may be programmed for determining zero crossing times for pairs 319. The zero crossing time can be determined as previously explained to estimate the zero crossing time for each pair of points. Accordingly, responsive to the plurality of pairs and the corresponding time values, the processor can determine a zero crossing time for each pair. The zero crossing time for each pair corresponds to the determined zero crossing time for the signal with noise filtered out.

The processor 307 may be programmed for correcting a variation in the plurality of zero crossing times 321. In response to the zero crossing time for each pair, the processor 307 can correct a variation in the zero crossing times. For example, the processor 307 can collect multiple zero crossing times over a window of time and take an average to determine how a zero crossing time should be adjusted. As another example, the correction can include averaging a periodicity of a waveform corresponding to the signal responsive to the zero crossing times. Accordingly, one or more embodiments provide that the correcting further includes instructions for providing phase correction, frequency correction and acceleration correction.

The processor 307 may be programmed for outputting a signal representative of the corrected zero crossing times 323. For example, one or more embodiments provides for outputting a data stream indicative of the corrected zero crossing times. The data stream can have values representing the corrected zero crossing times, can include a pulse representing when the zero crossing time occurs, can include a table with the corrected zero crossing times, can indicate the time, amplitude and period of the signal, or the like. Optionally, the pulse can indicate the polarity change to negative or positive. The data stream can be used within the device 301, such as by an application program, or can be output, e.g., via the timer 327, for use in an external device such as the illustrated power monitor, etc. 309.

One or more embodiments provides that all or a portion of the corrected zero crossing times, and/or the pairs of points and the corresponding time values can be saved, e.g., to a zero crossing database 325. Accordingly, the processor can save an amplitude value corresponding to each point and the time value corresponding thereto to memory.

FIG. 4-FIG. 7 provide examples of an analog signal, the analog signal contaminated with noise, the zero crossing of the signal with noise, and zero crossing of the signal with noise as determined in accordance with one or more embodiments. In this example, the analog signal generated is a 60 Hz signal. These examples illustrate the signal amplitude over the course of time.

Figure 4:
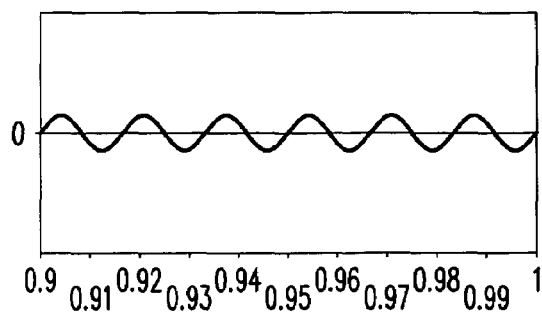
FIG. 4 illustrates an example of a signal wave form.

Referring now to FIG. 4, an example of a signal wave form will be discussed and described. As can be observed, the signal generally has the form of a sine wave. The signal changes polarity with regular periodicity. The actual zero crossings can be observed in FIG. 4.

Figure 5:
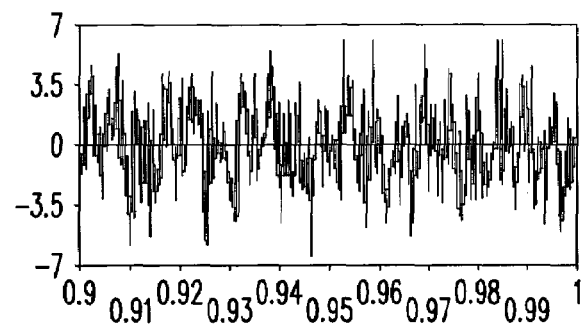
FIG. 5 illustrates an example of the signal wave form of FIG. 3 with noise introduced.

Referring now to FIG. 5, an example of the signal wave form of FIG. 4 with noise introduced will be discussed and described. The analog signal here has been contaminated with noise introduced, e.g., from the environment. The noise obscures the sine wave form of the signal. In fact, the noise introduces many erroneous zero crossing points into the signal. As can be observed in this example, there are many more zero crossing points in the noisy signal of FIG. 5 than in the original signal of FIG. 4.

Figure 6:
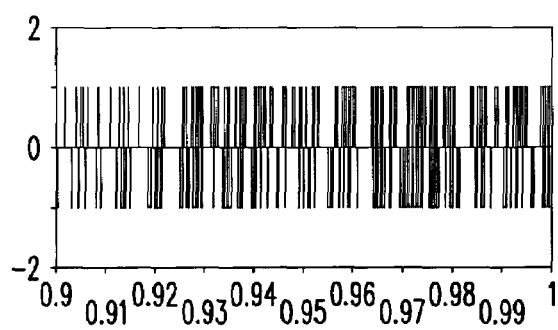
FIG. 6 illustrates an example indicating the zero crossings of the signal waveform of FIG. 5.

FIG. 6 is an example indicating the zero crossings of the signal waveform of FIG. 5. This example illustrates where the zero crossings of the noisy signal occur. There are numerous zero crossings, and they do not exhibit any periodicity.

Figure 7:
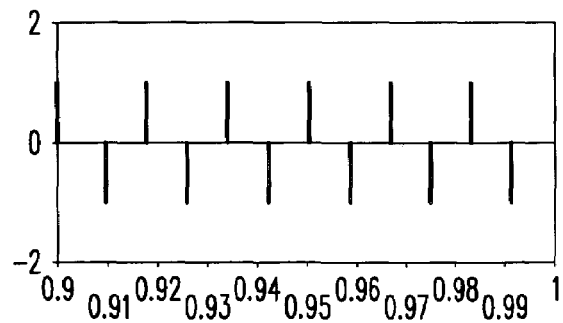
FIG. 7 illustrates an example indicating the zero crossings of the signal waveform of FIG. 5, in accordance with one or more embodiments of the present invention.

Referring now to FIG. 7, an example indicating the zero crossings of the signal waveform of FIG. 5, in accordance with one or more embodiments will be discussed and described. The signal with noise, e.g., the signal of FIG. 5, has been utilized in connection with one or more embodiments. The pulses shown in FIG. 7 provide an indication of the zero crossings. As can be observed, the zero crossings determined in the predictive example of FIG. 7 correspond to the actual zero crossings of FIG. 4.

Figure 8:
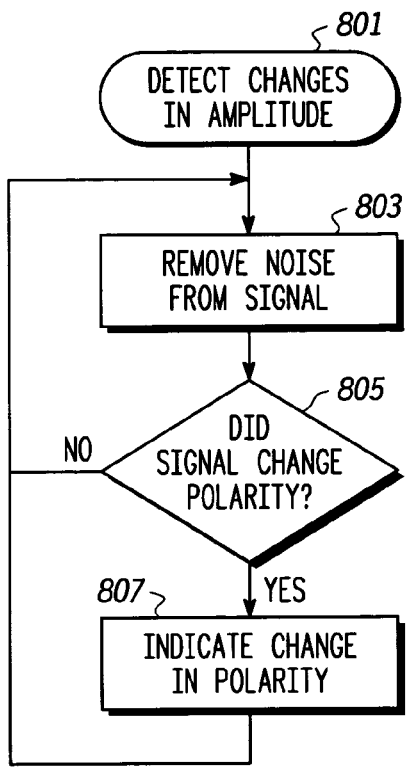
FIG. 8 is a flow chart illustrating an exemplary procedure for detecting changes in amplitude in accordance with various exemplary embodiments.
Figure 9:
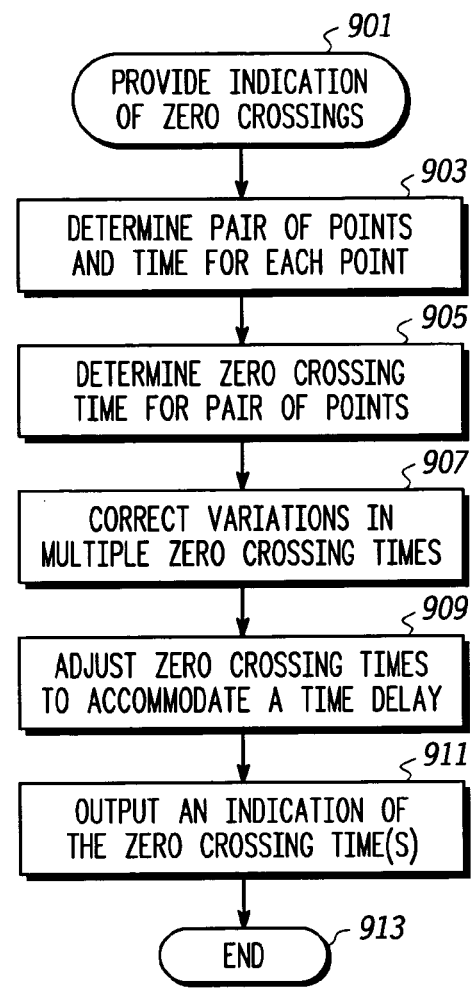
FIG. 9 is a flow chart illustrating an exemplary procedure for providing an indication of zero crossings in accordance with various exemplary embodiments.

FIG. 8 and FIG. 9 together provide an illustration of a process of providing an indication of zero crossings corresponding to a signal. In this exemplary embodiment, a detection of a change in polarity (FIG. 8) can cause an interrupt or similar, to initiate the process for indicating the zero crossings (FIG. 9). Alternative embodiments can provide non-interrupt driven processing.

Referring now to FIG. 8, a flow chart illustrating an exemplary procedure 801 for detecting changes in amplitude in accordance with various exemplary embodiments will be discussed and described. The procedure 801 can advantageously be implemented on, for example, a processor of a controller, described in connection with FIG. 3 or other apparatus appropriately arranged.

A signal has been received, e.g., an analog signal which has been converted to a digital signal, or a digital signal or other data has been received. Such signal can be provided by, e.g., a power generation system, a motor, a power supply, an audio component, a video representation, or the like, a digitized analog signal generated from, for example, such an analog signal, or digitally stored data.

The noise 803 can be removed from the signal. The noise can be filtered, for example, the removal of the noise can be performed in a bandpass filter, or in accordance with one or more embodiments, a bandpass finite impulse response (FIR) filter. It should be noted that the removing can introduce a time delay to the signal.

From the signal with the noise removed, it can be determined whether the polarity of the signal changed, e.g., whether a zero crossing occurred. If the signal 805 did change polarity, then the process can indicate 807 a change in polarity. One or more embodiments provide that the polarity of the point before the change and the polarity of the point after the change are stored, together with a time corresponding to each point. Accordingly, in response to the signal with noise removed, pairs of points and a time value corresponding to each point can be determined, wherein the points of each pair are proximate to a predetermined change in an amplitude of the signal.

Alternative exemplary embodiments can provide that a predetermined change in the amplitude can be utilized. The predetermined change can be, e.g., the change in polarity of the amplitude of the signal, a change of the amplitude of the signal to a predetermined maximum or minimum value, a change to an other predetermined value, another inflection in the wave form, or the like.

The digitized signal can be examined for the change as it is received. Accordingly, one or more embodiments provide for detecting the predetermined change. In an embodiment which is interrupt-driven, the change in polarity can result in issuance of an interrupt, e.g., commencing execution of the exemplary process of FIG. 9.

Referring now to FIG. 9, a flow chart illustrating an exemplary procedure 901 for providing an indication of zero crossings in accordance with various exemplary embodiments will be discussed and described. The procedure 901 can advantageously be implemented on, for example, a processor of a controller, described in connection with FIG. 3 or other apparatus appropriately arranged.

The procedure can determine 903 a pair of points and a time corresponding to each point. In the present example, the pair of points and time corresponding to each point can be obtained from, e.g., memory, can be received as input parameters, and the like.

A zero crossing time 905 can be calculated for the points of each pair, where they are proximate to, e.g., the change in polarity of the signal. In response to the pair or pairs of points and the corresponding time values, a zero crossing time can be determined for each pair. Various procedures for calculating the zero crossing time were previously described, including, for example, a linear extrapolation of the zero crossing calculated from the amplitude and time values of each point. E.g., a linear relationship between the points of each pair can be assumed and the process can then calculate the zero crossing times.

As the signal continues to be processed, the signal can result in a stream of zero crossing times. It is possible for the periodicity of the zero crossing times to vary, as could happen e.g. with a cyclic distortion in the waveform or due to other causes. One or more embodiments provides for the zero crossing times to be corrected for this variation. Accordingly, the process can provide for correcting 907 one or more variations in the multiple zero crossing times. In accordance with one or more embodiments, a periodicity of a waveform corresponding to the signal is averaged, responsive to the zero crossing times.

Moreover, the process can provide for an adjustment 909 to accommodate a time delay which can be introduced by earlier processing. For example, processing a signal in an FIR filter can introduce a time delay to the signal. Accordingly, the zero crossing times can be adjusted to accommodate the time delay. The time delay or delays can be indicated by those processes that introduce the time delays.

The process can also provide for outputting 911 an indication of the corrected zero crossing time(s), such as a signal representative of the corrected zero crossing times. Various possibilities for the signal were discussed previously.

One or more embodiments further comprises providing the output signal to a controller or other component, e.g., of an external device such as a portable generator, a power monitoring device, a power metering device, a power control system, a power factor measurement and/or correction device, a phase control application, a lighting system, an audio system, a motor, or the like. Such a signal indicates where the zero crossing is expected and can advantageously yield a more accurate expectation of the cycle of the signal, so that various applications can synchronize more accurately with the signal.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of providing an indication of zero crossings corresponding to a signal, comprising:
   receiving the signal;
   removing noise from the signal;
   responsive to the signal with noise removed, first determining a plurality of pairs of points and a time value corresponding to each point, wherein the points of each pair are proximate to a predetermined change in an amplitude of the signal;
   responsive to the plurality of pairs and the corresponding time values, second determining a zero crossing time for each pair;
   correcting a variation in the plurality of zero crossing times; and
   outputting an output signal representative of the corrected zero crossing times.

2. The method of claim 1, further comprising providing the output signal to a controller.

3. The method of claim 1, wherein the second determining assumes a linear relationship between the points of each pair and calculates the zero crossing times.

4. The method of claim 1, wherein the correcting further comprises averaging a periodicity of a waveform corresponding to the signal responsive to the zero crossing times.

5. The method of claim 1, wherein the signal is received as analog, the method further comprising converting the received signal to digital.

6. The method of claim 1, wherein the correcting is performed in a third order filter.

7. The method of claim 1, wherein the removing is performed in a bandpass finite impulse response (FIR) filter.

8. The method of claim 1, wherein the removing introduces a time delay to the signal, the method further comprising adjusting the plurality of zero crossing times to accommodate the time delay.

9. The method of claim 1, wherein the predetermined change is a polarity change.

10. The method of claim 1, wherein the first determining includes detecting the predetermined change.

11. A computer-readable medium comprising instructions executable by a processor, the instructions including a computer-implemented method for indicating zero crossings in a signal, the instructions for implementing the steps of:
- responsive to the signal, wherein the signal has noise removed, determining a plurality of pairs of points and a time value corresponding to each point, wherein the points of each pair are proximate to a change in polarity of an amplitude of the signal;
- responsive to the plurality of pairs and the corresponding time values, performing a calculation of a zero crossing time for each pair;
- correcting a variation in the plurality of zero crossing times; and
- outputting a data stream indicative of the corrected zero crossing times.

12. The medium of claim 11, wherein the correcting further comprises instructions for averaging a periodicity of a waveform corresponding to the signal responsive to the zero crossing times.

13. The medium of claim 11, wherein the noise removal introduces a time delay to the signal, further comprising instructions for adjusting the plurality of zero crossing times to accommodate the time delay.

14. The medium of claim 11, further comprising instructions for saving an amplitude value corresponding to each point and the time value corresponding thereto to memory.

15. The medium of claim 11, wherein the correcting further includes instructions for providing phase correction, frequency correction and acceleration correction.

16. A device for providing an indication of zero crossings corresponding to a signal, comprising:
- a receiver, responsive to receiving the signal;
- an analog/digital converter, responsive to the received signal, to digitize the received signal;
- a bandpass finite impulse response (FIR) filter, responsive to the digitized signal, to remove noise from the digitized signal; and
- a processor, the processor being configured to facilitate, responsive to the signal with noise removed, determining a plurality of pairs of points and a time value corresponding to each point, wherein the points of each pair are proximate to a change in polarity of an amplitude of the signal; responsive to the plurality of pairs and the corresponding time values, performing a calculation of a zero crossing time for each pair; and responsive to the zero crossing time for each pair, correcting a variation in the plurality of zero crossing times and outputting a data stream indicative of the corrected zero crossing times.

17. The device of claim 16, wherein the correcting further comprises averaging a periodicity of a waveform corresponding to the signal responsive to the zero crossing times.

18. The device of claim 16, wherein the bandpass FIR filter introduces a time delay to the signal, wherein the processor is further configured to facilitate adjusting the plurality of zero crossing times to accommodate the time delay.

19. The device of claim 16, wherein the determining includes detecting the change in polarity.

20. The device of claim 16, wherein the processor is further configured to facilitate saving an amplitude value corresponding to each point and the time value corresponding thereto to memory.

* * * * *